(12) United States Patent
Wang et al.

(10) Patent No.: US 10,146,085 B2
(45) Date of Patent: Dec. 4, 2018

(54) DISPLAY DEVICE

(71) Applicant: InnoLux Corporation, Miao-Li County (TW)

(72) Inventors: Hui-Chi Wang, Miao-Li County (TW); Hsia-Ching Chu, Miao-Li County (TW); Mei-Chun Shih, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/643,643

(22) Filed: Jul. 7, 2017

(65) Prior Publication Data

US 2018/0017828 A1  Jan. 18, 2018

(30) Foreign Application Priority Data

Jul. 13, 2016  (CN) .......................... 2016 1 0547997

(51) Int. Cl.
| | |
|---|---|
| *G02F 1/1333* | (2006.01) |
| *G02F 1/1335* | (2006.01) |
| *H01L 51/52* | (2006.01) |
| *H01L 33/48* | (2010.01) |
| *H01L 33/58* | (2010.01) |

(52) U.S. Cl.
CPC .. *G02F 1/133528* (2013.01); *G02F 1/133305* (2013.01); *G02F 1/133308* (2013.01); *H01L 51/5246* (2013.01); *H01L 51/5293* (2013.01); *G02F 2001/133331* (2013.01); *G02F 2001/133388* (2013.01); *H01L 33/483* (2013.01); *H01L 33/58* (2013.01); *H01L 2251/5338* (2013.01)

(58) Field of Classification Search
CPC ......... G02F 1/133528; G02F 1/133305; G02F 1/133308
USPC .......................................................... 349/58
See application file for complete search history.

(56) References Cited

U.S. PATENT DOCUMENTS

| | | | |
|---|---|---|---|
| 2007/0097300 A1* | 5/2007 | Lee ........................... | C08L 1/12 349/117 |
| 2009/0103017 A1* | 4/2009 | Maezawa .......... | G02F 1/133528 349/96 |
| 2016/0293869 A1* | 10/2016 | Saeki .................. | H01L 51/0097 |

* cited by examiner

*Primary Examiner* — Lucy Chien
(74) *Attorney, Agent, or Firm* — Bacon & Thomas, PLLC (57) ABSTRACT

A display device includes: a substrate; a display medium layer disposed on the substrate; and a polarizer having a first film, a second film and a third film sequentially laminated on the display medium layer. The second film connects to the first film. The third film connects to the second film. A first bottom surface of the first film has a first edge. A second bottom surface of the second film has a second edge. A third bottom surface of the third film has a third edge. A first minimum distance exists between projections of the first edge and the second edge on the substrate in a first direction perpendicular to a normal direction of the substrate, and a second minimum distance exists between the second edge and the third edge on the substrate in the first direction. The first minimum distance is different from the second minimum distance.

19 Claims, 9 Drawing Sheets

FIG. 18

US 10,146,085 B2

DISPLAY DEVICE

CROSS REFERENCE TO RELATED APPLICATION

This application claims the benefits of the Chinese Patent Application Serial Number 201610547997.1, filed on Jul. 13, 2016, the subject matter of which is incorporated herein by reference.

BACKGROUND

1. Field

The present disclosure relates to a display device, and more particularly to a display device that has a polarizer featuring for a non-flush edge.

2. Description of Related Art

With the continuous progress of display technology, the current trend for all display panels is toward compactness, thinness and lightness. Thus, thin monitors, such as liquid crystal display panels, organic light-emitting diode display panels, inorganic light-emitting diode display panels and the like, have replaced cathode-ray tube displays become the most popular display devices currently in the market. Thin monitors are extensively applicable, and can be seen all around us in our daily life. For example, display panels used in mobile phones, laptop computers, cameras, still cameras, music players, navigators, and TV sets are usually thin display panels.

While liquid crystal display devices and organic light-emitting diode display devices are popular on the market, in which LCD display devices particularly enjoy technical maturity, manufacturers pay even more effort to improve display devices in terms of display quality thereby answering to ongoing technical development of display devices and consumers' increasing demands.

Particularly, the modern display devices are made with their border narrower and narrower. When the border is narrowed, the polarizer's edge may be extra visible to the user, making the display area look narrower. In view of this, there is a need for a novel display device that has its polarizer's edge less visible, thereby optimizing the visible range.

SUMMARY

The primary objective of the present disclosure is to provide a display device, which has a polarizer featuring for a special structural design at its edge for making the polarizer' edge less visible.

In one aspect of the present disclosure, the display device comprises: a substrate; a display medium layer, disposed on the substrate; and a polarizer, disposed on the display medium layer, wherein the polarizer at least comprises a first film, a second film, and a third film that are sequentially laminated, the first film connects to the second film, the second film connects to the third film, the first film has a first bottom surface, that the first bottom surface has a first edge, the second film has a second bottom surface, that the second bottom surface has a second edge adjacent to the first edge, the third film has a third bottom surface, and the third bottom surface has a third edge adjacent to the second edge, wherein, in a first direction perpendicular to the first edge in which the first direction is perpendicular to a normal direction of the substrate, a first minimum distance exists between a projection of the first edge and a projection of the second edge on the substrate, a second minimum distance exists between the projection of the second edge and a projection of the third edge on the substrate, and the first minimum distance and the second minimum distance are different.

In another aspect of the present disclosure, a substrate; a display medium layer, disposed on the substrate; and a polarizer, disposed on the display medium layer, wherein the polarizer at least comprises a first film, a second film, and a third film that are sequentially laminated, the first film connects to the second film, the second film connects to the third film, the polarizer has a top surface and a bottom surface, the bottom surface is a surface of the polarizer facing the display medium layer, and the top surface is opposite to the bottom surface; wherein, in a cross-section view of the substrate, a fourth edge of the top surface of the polarizer and a fifth edge of the bottom surface of the polarizer form an imaginary line, a first bottom surface of the first film has a first edge, a second bottom surface of the second film has a second edge, a third bottom surface of the third film has a third edge, the third edge is adjacent to the second edge, a third minimum distance is a distance between the second edge and the imaginary line, a fourth minimum distance is a distance between the third edge and the imaginary line, and the third minimum distance is different from the fourth minimum distance.

In the foregoing aspects of the present disclosure, when a first minimum distance between a projection of the first edge of the first film and a projection of the second edge of the second film on the substrate is different from a second minimum distance between the projection of the second edge of the second film and a projection of a third edge of the third film on substrate, or when a third minimum distance between the second edge of the second film and an imaginary line formed by the top and bottom surfaces of the polarizer is different from a fourth minimum distance between the third edge of the third film and the imaginary line, the polarizer has a non-flush edge design, which allows the polarizer's edge and the display device's border area to be compatible in terms of brightness, so as to visually blur the polarizer's edge, thereby making the polarizer's edge less visible.

Additionally, in the foregoing aspects of the present disclosure, the display device may further comprise: a frame, surrounding the substrate; and a colloid, disposed between the frame and the polarizer. As described previously, in the disclosed display device, the polarizer has a non-flush edge design. When there is the colloid between the frame and the polarizer, due to the polarizer's non-flush edge design, the contact area between the colloid and the polarizer is increased, thereby suppressing contract and expansion of the film layers of the polarizer caused by temperature variation, and ensuring good match between the polarizer and the display medium layer, so as to prevent light leakage.

Other objects, advantages, and novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" or "third" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other substrate or film, but also intended indirectly contact with the other substrate or film.

Embodiment 1

Figure 1:
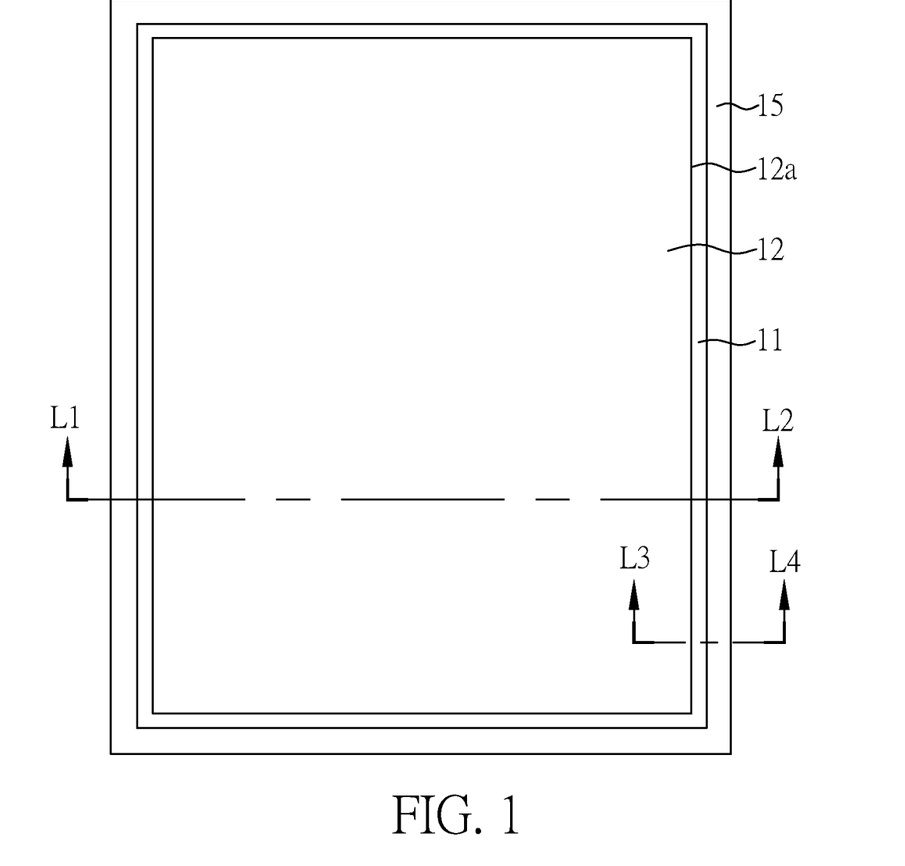
FIG. 1 is a top view of a display device according to Embodiment 1 of the present disclosure.
Figure 2:
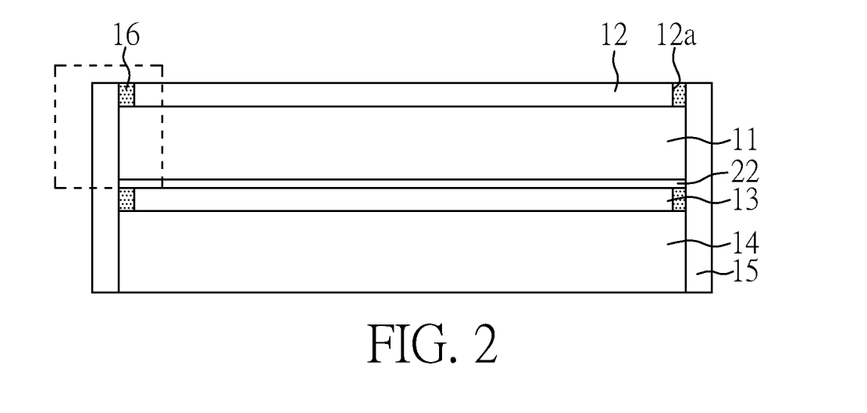
FIG. 2 is a cross-sectional view of the display device according to Embodiment 1 of the present disclosure.

FIG. 1 is a top view of a display device according to the present embodiment. FIG. 2 is a cross-sectional view taken along Section Line L1-L2 of FIG. 1. In the present embodiment, the display device comprises: a display panel 11; an upper polarizer 12, disposed on one side of the display panel 11; and a lower polarizer 13, disposed on an opposite side of the display panel 11. In addition, the display panel of the present embodiment is a liquid crystal display panel, so the display device of the present embodiment further comprises a backlight module 14, disposed below the lower polarizer 13. The display panel 11, the upper polarizer 12, the lower polarizer 13, and the backlight module 14 are all assembled and disposed corresponding to a frame 15, with the space between the upper polarizer 12/the lower polarizer 13 and the frame 15 optionally filled with a colloid 16.

Figure 3A:
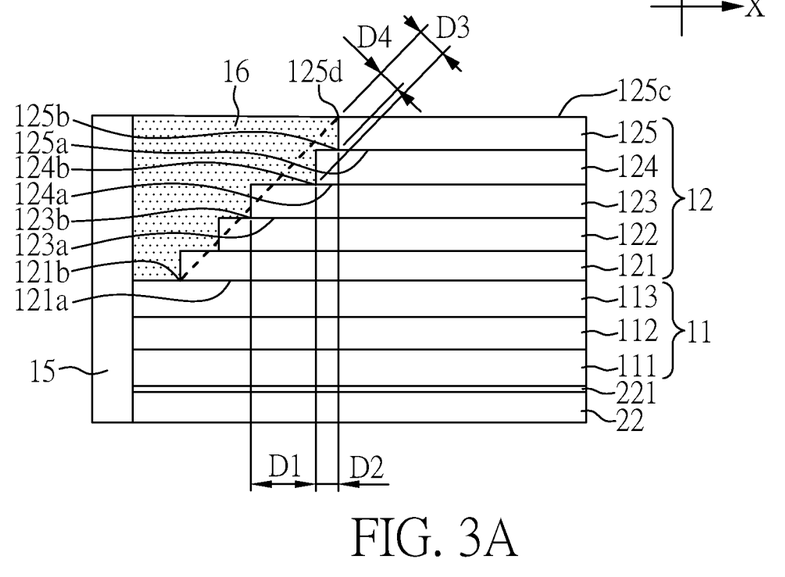
FIG. 3A is a partial, cross-sectional view of the display device according to Embodiment 1 of the present disclosure.

FIG. 3A is a partial, cross-sectional view of the display device according to the present embodiment, specially showing the area framed by the dotted lines in FIG. 2. As shown in FIG. 3A, in the display device of the present embodiment, the display panel 11 comprises: a substrate 111; a counter substrate 113, opposite to the substrate 111; and a display medium layer 112, disposed between the substrate 111 and the counter substrate 113. In the present embodiment, the display medium layer 112 is a liquid crystal display layer, and other elements required by a display panel may be disposed on the substrate 111 and/or the counter substrate 113. For example, the substrate 111 may comprise thin-film transistor units, an alignment layer, electrodes and so on, while the counter substrate 113 may comprise a color filter unit, a black array, an alignment layer, electrodes and so on. However, the present disclosure is not limited thereto, and these and other elements may be optionally disposed on the substrate 111 and/or the counter substrate 113.

In the present embodiment, the substrate 111 and the counter substrate 113 may be a flexible substrate, such as a plastic substrate, a thin glass substrate, and so on. In this case, for improving the rigidity of the substrate 111, the display device of the present embodiment may further comprise a support portion 22 disposed below the substrate 11, and an adhesive material 221 disposed between the support portion 22 and the substrate 111. However, the present disclosure is not limited thereto, and the substrate 111 and the counter substrate 113 may alternatively be hard substrates, such as thick glass substrates. In this case, provision of the support portion 22 is optional.

In the present embodiment, as shown in FIG. 2, the upper polarizer 12 and the lower polarizer 13 may be structurally identical or similar, and the description herein is only directed to the upper polarizer 12 for clarity. As shown in FIG. 3A, the upper polarizer 12 used in the display device of the present embodiment at least comprises a first film 123, a second film 124, and a third film 125 sequentially laminated. The second film 124 is disposed on the first film 123 and connects to the first film 123. The third film 125 is disposed on the second film 124 and connects to the second film 124. More particularly, the upper polarizer 12 used in the present embodiment comprises: an adhesive layer 121; a first protective layer 122, disposed on the adhesive layer 121; a first film 123, disposed on the first protective layer 122; a second film 124, disposed on the first film 123 and connecting to the first film 123; and a third film 125, disposed on the second film 124 and connecting to the second film 124. Therein, connections between the film layers may be realized by means of adhesion or coating.

Herein, at least two of the first film 123, the second film 124, and the third film 125 could be made of different materials. More particularly, in the present embodiment, the upper polarizer 12 is adhered to the display panel 11 through the adhesive layer 121. The adhesive layer 121 is typically made of pressure sensitive adhesive (PSA). The first protective layer 122 mainly serves to protect the integrity of the first film 123 above it, to prevent the first film 123 from shrinkage, or to provide the display device with a wide viewing angle. The first protective layer 122 may be made of, for example, Triacetate cellulose (TAC). In this embodiment, the first film 123 could form the key film layer that makes the polarizer polarizing by absorbing light in a certain electric field direction. The first film 123 may be, for example, a polymeric thin film adsorbing with a dichroic substance (e.g. iodine-based substances, dye-containing substances, and so on), such as a polyvinyl alcohol (PVA) film. The second film 124 may be made of, for example, TAC, for protecting the integrity of the first film 123 below it, and preventing the first film 123 from shrinkage. The third film 125 is, for example, a surface protecting layer, which may be film layer equipped with features according to practical needs, such as an anti-reflection layer, a low-reflection layer or an anti-glare for minimizing the ambient effects on the display device, or an anti-dirt layer that improves resistance to dirt, or a highly rigid layer that improves surface hardness.

It is to be noted that the above paragraphs are merely description to one embodiment of the present disclosure. In the present disclosure, the first film is not necessarily made of PVA, the second film is not necessarily made of TAC, and the third film is not necessarily served as a surface protecting layer. Whenever the first film, the second film, and the third film jointly form three continuous layers of the polarizer, and are such configured that the first film connects to one side of the second film, and the third film connects to another side of the second film, they are the first film, the second film, and the third film as claimed in the present disclosure. Herein, the term "connecting to" or "connects to" is defined as connection between two film layers realized by colloid connecting, coating or the layers' own adhesion.

As shown in FIG. 1 and FIG. 2, as the display device is made borderlessly, the edge 12a of the upper polarizer 12 becomes more visible to the user, and the display area could be looked like narrower due to the apparently visible edge 12a of the polarizer. For solving this problem, the upper polarizer 12 of the present embodiment has a special structural design that can make the edge 12a of the upper polarizer 12 less visible. This disclosure is not limited to the borderlessly display device, and it could other display device with narrower border region.

Figure 4:
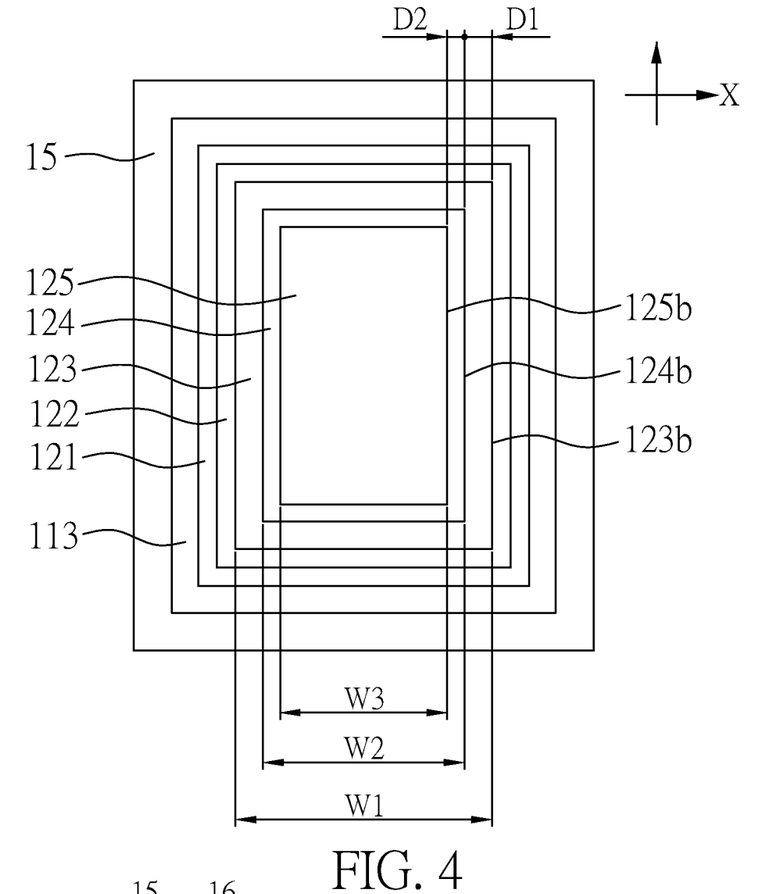
FIG. 4 is a top view of an upper polarizer disposed on the display panel according to Embodiment 1 of the present disclosure.

FIG. 4 is a top view of the upper polarizer disposed on the display panel of the present embodiment. However, the film layers of the upper polarizer and the display panel in FIG. 4 are not made to scale. What is shown is for clearly depicting the relationship between the film layers of the upper polarizer. As shown in FIG. 3A and FIG. 4, the edge 12a (as shown in FIG. 1 and FIG. 2) of the upper polarizer 12 of the present embodiment has a stair-like design. More particularly, a first bottom surface 123a of the first film 123 has a first edge 123b, a second bottom surface 124a of the second film 124 has a second edge 124b adjacent to the first edge 123b, and a third bottom surface 125a of the third film 125 has a third edge 125b adjacent to the second edge 124b. Therein, in a first direction X perpendicular to the first edge, a first minimum distance D1 exists between a projection of the first edge 123b and a projection of the second edge 124b on the substrate 111, and a second minimum distance D2 exists between the projection of the second edge 124b and a projection of the third edge 125b on the substrate 111. The first minimum distance D1 and the second minimum distance D2 are both greater than zero and are different from each other. Herein, the first direction X is perpendicular to the normal direction of the substrate 111.

Moreover, as shown in FIG. 3A, the upper polarizer 12 has a top surface 125c and a bottom surface 121a. The bottom surface 121a is the surface of the upper polarizer 12 facing the display medium layer 112, and the top surface 125c is opposite to the bottom surface 121a. Therein, in a cross-section of the substrate 111 (i.e. the view shown in FIG. 3A), a fourth edge 125d of the top surface 125c of the upper polarizer 12 and a fifth edge 121b of the bottom surface 121a of the upper polarizer 12 form an imaginary line (as denoted by the dotted line). A first bottom surface 123a of the first film 123 has a first edge 123b, a second bottom surface 124a of the second film 124 has a second edge 124b, a third bottom surface 125a of the third film 125 has a third edge 125b, and a third edge 125b is adjacent to the second edge 124b. A third minimum distance D3 is a distance between the second edge 124b and the imaginary line as denoted by the dotted line, and a fourth minimum distance D4 is a distance between the third edge 125b and the imaginary line as denoted by the dotted line. The third minimum distance D3 is different from the fourth minimum distance D4. In one embodiment, the third minimum distance D3 is greater than or equal to 0.001 mm and less than or equal to 0.1 mm.

As described previously, when the first minimum distance D1 between the projection of the first edge 123b of the first film 123 and the projection of the second edge 124b of the second film 124 on the substrate 111 is different from the second minimum distance D2 between the projection of the second edge 124b of the second film 124 and the projection of the third edge 125b of the third film 125 on the substrate 111, or when the third minimum distance D3 between the second edge 124b of the second film 124 and the imaginary line (as denoted by the dotted line) is different from the fourth minimum distance D4 between the third edge 125b of the third film 125 and the imaginary line, the upper polarizer 12 has a non-flush-edge design. With the non-flush-edge design, light irradiates onto the upper polarizer 12 could be scattered at the non-flush edge, thereby visually blurring the edge of the upper polarizer 12. In addition, the brightness at the edge of the upper polarizer 12 is compatible to the brightness at a border region of the display device (not shown in the figure), thereby making the edge of the upper polarizer 12 less visible to the user.

Additionally, in the present embodiment, as shown in FIG. 4, in the first direction, a width W1 of the first film 123 is greater than a width W2 of the second film 124, and the width W2 of the second film 124 is greater than the width W3 of the third film 125. While the description herein is only directed to the short sides of the first film, second film and third film of the display device, the present disclosure is not limited thereto, and the display device may have their long sides optionally designed with the same features.

Furthermore, in the present embodiment, as shown in FIG. 4, in the normal direction view of the substrate, the second edge 124b of the second film 124 is exposed by the third film 125, and the first edge 123b of the first film 123 is exposed by the second film 124. While the description herein is directed to an edge of the upper polarizer, the present disclosure is not limited thereto, and the upper polarizer may have any side optionally designed with the same features.

Figure 3B:
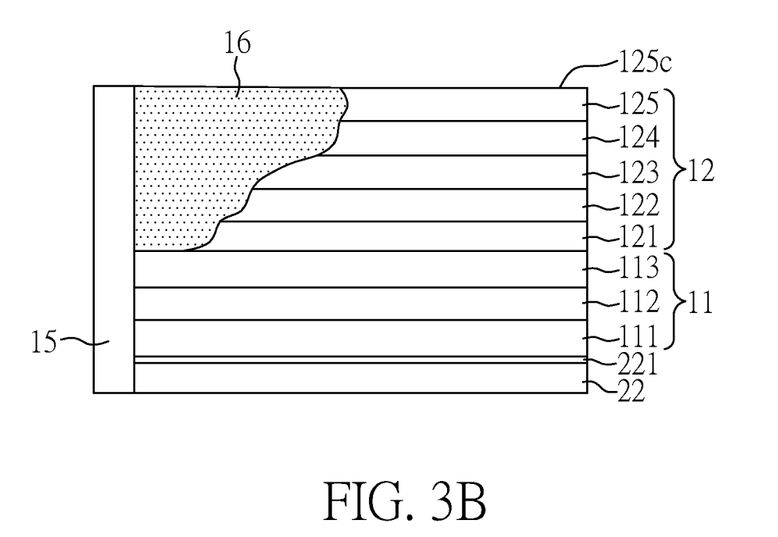
FIG. 3B is a partial, cross-sectional view of another display device according to Embodiment 1 of the present disclosure.

Therefore, as shown in FIG. 3A and FIG. 4, the upper polarizer 12 used in the present embodiment has a stair-like lateral, so as to allow light irradiated onto the upper polarizer 12 to be scattered at the non-flush edge, and reduce the visibility of the edge 12a (as shown in FIG. 1 and FIG. 2) of the upper polarizer 12. In one embodiment, the lateral wall of the upper polarizer has a rough surface. In another embodiment, the lateral walls of the film layers of the upper polarizer have different levels of roughness, so as to scatter light even better, and in turn make the upper polarizer edge and the border compatible in terms of brightness, thereby optimizing the visible range, as shown in FIG. 3B.

Moreover, as shown in FIG. 3A and FIG. 4, the display device of the present embodiment may further comprise: a frame 15, surrounding the substrate 111; and a colloid 16, disposed between the frame 15 and the upper polarizer 12. As described previously, in the display device of the present embodiment, the upper polarizer 12 has a non-flush edge design. When there is the colloid 16 disposed between the frame 15 and the upper polarizer 12, due to the non-flush edge design of the upper polarizer 12, the contact area between the colloid 16 and the upper polarizer 12 is increased, thereby suppressing contract and expansion of the film layers in the upper polarizer 12 caused by temperature variation, and ensuring good match between the upper polarizer 12 and the display medium layer 112, so as to prevent light leakage.

Embodiment 2

Figure 5:
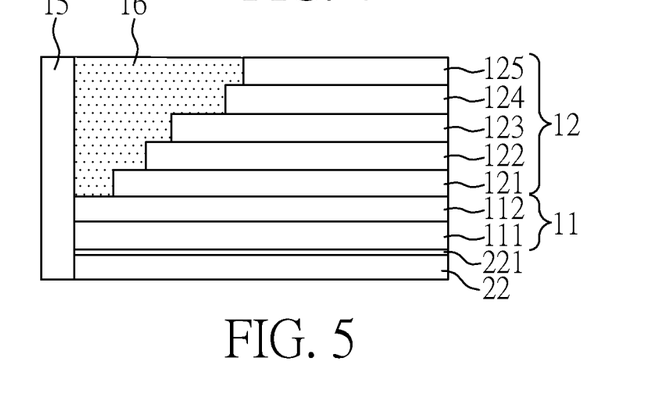
FIG. 5 is a partial, cross-sectional view of a display device according to Embodiment 2 of the present disclosure.

FIG. 5 is a partial, cross-sectional view of the display device of the present embodiment. The display device of the present embodiment is structurally similar to the display device of Embodiment 1, but has some differences as stated below.

The display device of Embodiment 1 is a liquid crystal display device, and the display device of the present embodiment is an organic light-emitting diode display device. Thus, referring to FIG. 2, in the display device of the present embodiment, the backlight module 14 and the lower polarizer 13 of Embodiment 1 can be omitted.

Additionally, as shown in FIG. 5, in the present embodiment, the upper polarizer 12 may be directly disposed on the display medium layer 112 of the display panel 11, and the display panel of the present embodiment 11 could not have the counter substrate 113 as shown in FIG. 3A. However, the present disclosure is not limited thereto. In another embodiment of the present disclosure where the display device is an organic light-emitting diode display device, the display panel 11 may also comprise a counter substrate 113 as shown in FIG. 3A. Alternatively, the counter substrate 113 as shown in FIG. 3A may be replaced by a protecting film that prevent moisture from penetrating into the display medium layer 112 formed by organic light-emitting diodes. It is to be noted that, the present disclosure may alternatively be a micro LED display apparatus, with its display medium layer 112 formed by inorganic light emitting diodes with micrometer size (micro LEDs). The micro LEDs may be formed on the substrate by means of bonding or epitaxial growth.

Embodiment 3

Figure 6:
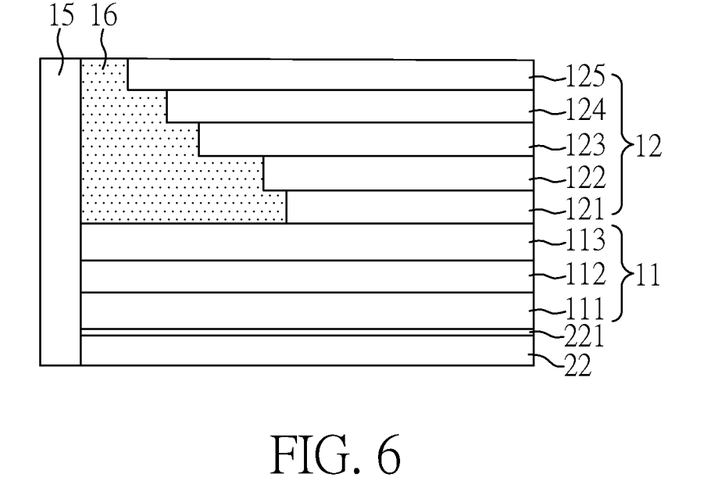
FIG. 6 is a partial, cross-sectional view of a display device according to Embodiment 3 of the present disclosure.
Figure 7:
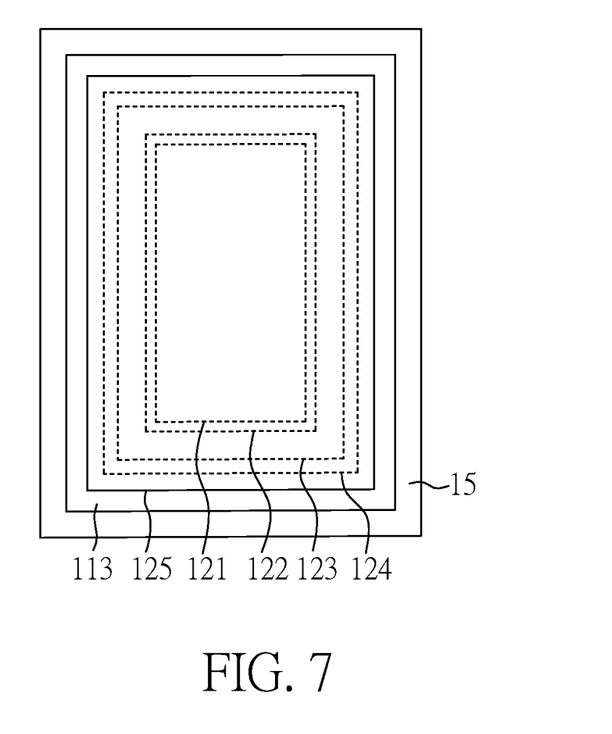
FIG. 7 is a top view of an upper polarizer disposed on the display panel according to Embodiment 3 of the present disclosure.

FIG. 6 is a partial, cross-sectional view of the display device of the present embodiment. FIG. 7 is a top view of the upper polarizer disposed on display panel according to the present embodiment. The display device of the present embodiment is structurally similar to the display device of Embodiment 1, but has the following differences.

As shown in FIG. 3A, in the Embodiment 1, the film layers of the upper polarizer 12 have an upward tapering design from the display panel 11. As shown in FIG. 6, in the present embodiment, the film layers of the upper polarizer 12 have an upward expanding design from the display panel 11. However, either using the upward tapering design as shown in FIG. 3A or the upward expanding design of FIG. 6, the upper polarizer 12 is of a non-flush edge design. This serves to increase the contact area between the colloid 16 and the upper polarizer 12, thereby suppressing contract and expansion of the film layers in the upper polarizer 12 caused by temperature variation, and ensuring good match between the upper polarizer 12 and the display medium layer 112, so as to prevent light leakage.

Embodiment 4

Figure 8:
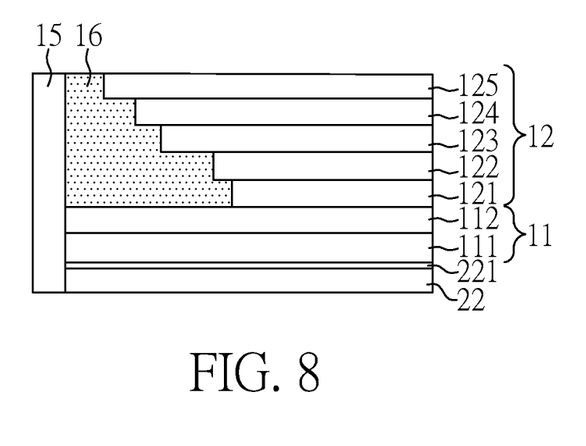
FIG. 8 is a partial, cross-sectional view of a display device according to Embodiment 4 of the present disclosure.

FIG. 8 is a partial, cross-sectional view of the display device of the present embodiment. The display device of the present embodiment is structurally similar to the display device of Embodiment 3, but the display device of Embodiment 3 is a liquid crystal display device, yet the display device of the present embodiment is an organic light-emitting diode display device or inorganic light-emitting diode display device (micro LED). Hence, in the present embodiment, the display device shares all features of Embodiment 2 except for the structure of the upper polarizer.

Embodiment 5

Figure 9:
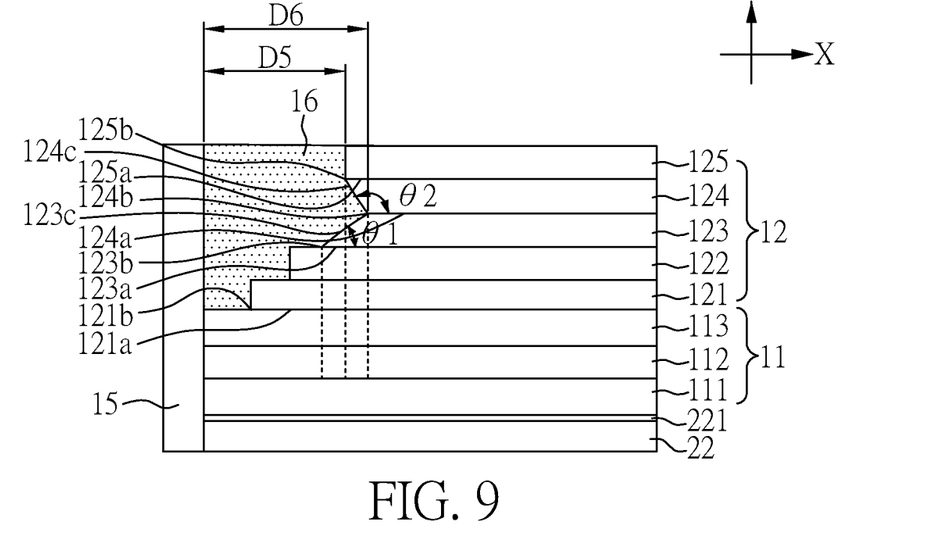
FIG. 9 is a partial, cross-sectional view of a display device according to Embodiment 5 of the present disclosure.
Figure 10:
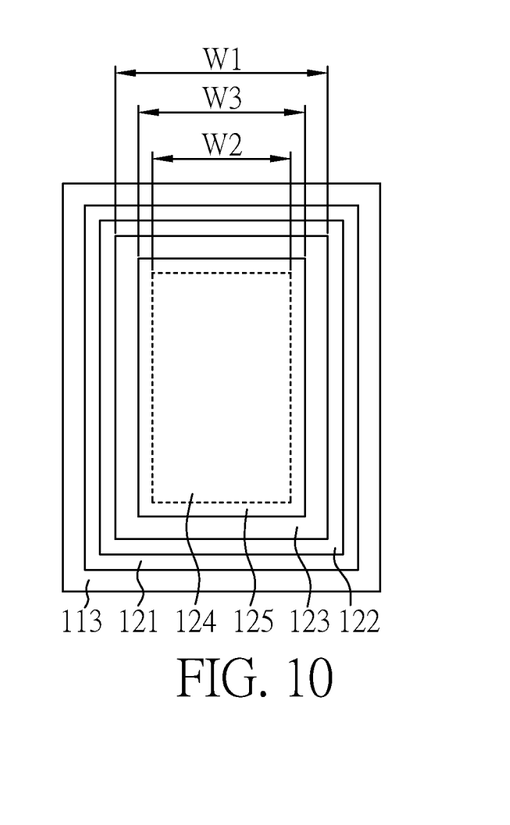
FIG. 10 is a top view of an upper polarizer disposed on the display panel according to Embodiment 5 of the present disclosure.
Figure 11:
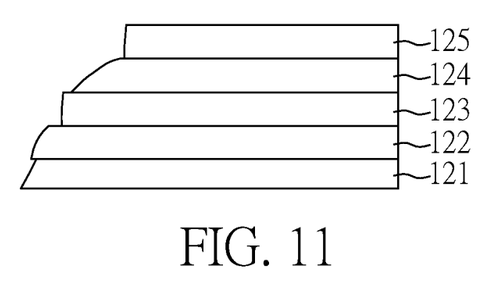
FIG. 11 through FIG. 14 are partial, cross-sectional views of the upper polarizer according to other embodiments of the present disclosure.
Figure 12:
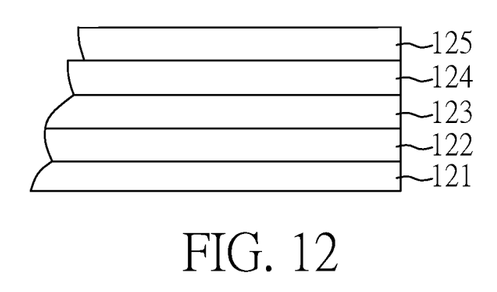
Figure 13:
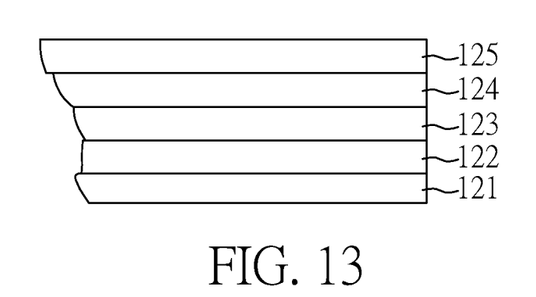
Figure 14:
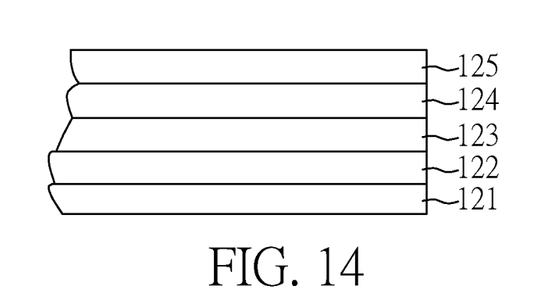

FIG. 9 is a partial, cross-sectional view of the display device of the present embodiment. FIG. 10 is a top view of the upper polarizer disposed on display panel according to the present embodiment. The display device of the present embodiment is structurally similar to the display device of Embodiment 1, but the film layers of the upper polarizer 12 of the present embodiment does not have the upward tapering design from the display panel 11 as described in Embodiment 1.

Particularly, as shown in FIG. 10, in the first direction, the width W2 of the second film 124 (measured at the second bottom surface 124a of the second film 124) is less than the width W3 of the third film 125 and the width W1 of the first film 123 (measured at the first bottom surface 123a of the first film 123). In other words, the projection of the second film 124 (or its second edge 124b) on the substrate 111 is located within the projection of the first film 123 on the substrate 111, and the projection of the second film 124 on the substrate 111 is located within the projection of the third film 125 (or its third edge 125b) on the substrate 111.

As shown in FIG. 9, the display device of the present embodiment further comprises a frame 15 surrounding the substrate 111. The horizontal minimum distance D6 from the second edge 124b of the second film 124 to the frame 15 is greater than the horizontal minimum distance D5 from the third edge 125b of the third film 125 to the frame 15. Herein, the so-called "horizontal minimum distances D5, D6" refers to the distance in the direction perpendicular to the first edge 121b and perpendicular to the normal direction of the substrate 111.

Additionally, the display device of the present embodiment further comprises a colloid 16. The colloid 16 is disposed between the frame 15 and the upper polarizer 12. In the present embodiment, since the second film 124 in the upper polarizer 12 is more concave as compared to the first film 123 and the third film 125, some of the colloid 16 is further disposed between the first film 123 and the third film 125.

Moreover, in the upper polarizer 12 of the present embodiment, the first film 123 has a first lateral wall 123c, so that a first angle θ1 is included between the first lateral wall 123c and the first bottom surface 123a, and the second film 124 has a second lateral wall 124c, so that a second angle θ2 is included between the second lateral wall 124c and the second bottom surface 124a. Therein, the first included angle θ1 is different from second included angle θ2.

Furthermore, the display device of the present embodiment further comprises a support portion 22, wherein the substrate 111 is disposed on the support portion 22, and an area of the substrate 111 is greater than an area of the support portion 22. In addition, the display device of the present embodiment further comprises an adhesive material 221 disposed between the support portion 22 and the substrate 111. However, in other embodiments of the present disclosure, the area of the substrate 111 may be equal to the area of the support portion 22. When the display device is an organic light-emitting diode display device or inorganic light-emitting diode display device with micrometer size, particularly when the substrate 111 is a flexible substrate, the area of the substrate 111 is greater than that the area of the support portion 22, so as to block moisture and oxygen.

OTHER EMBODIMENTS

In each Embodiments 1 through 5 as described above, the cross-section of the upper polarizer of the display device has a regular, rectangle design. However, the present disclosure is not limited thereto. FIG. 11 through FIG. 14 are cross-sectional views of alternative upper polarizers in some additional embodiments of the present disclosure. As shown, the upper polarizer of the disclosed display device is unnecessary in a regular shape. As long as the upper polarizer has a non-flush edge, it serves to the objective of the present disclosure, namely making the polarizer's edge less visible and improving reliability.

Test Example

Figure 15:
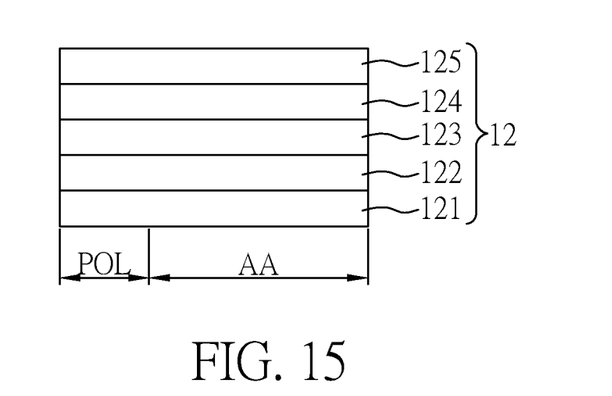
FIG. 15 through FIG. 17 are partial, cross-sectional views of the upper polarizer used in Test example of the present disclosure.
Figure 16:
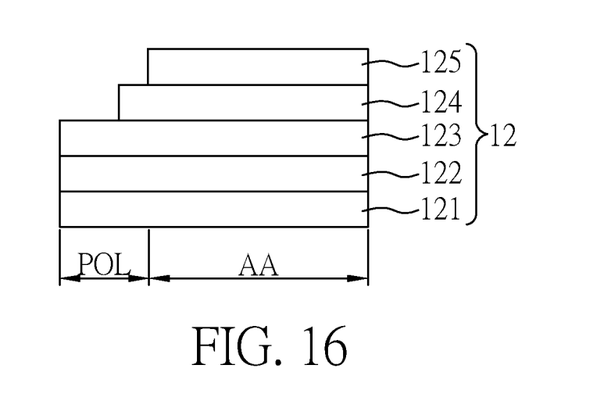
Figure 17:
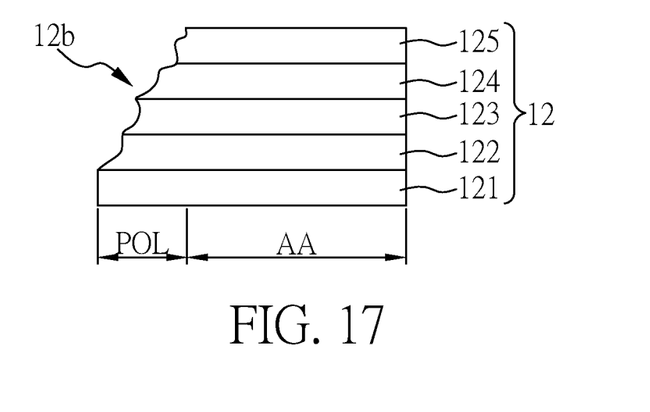

In the present test example, the display device of Embodiment 1 was tested by measuring the brightness in the capturing area L3-L4 as shown in FIG. 1. In the present test example, the structures of the tested upper polarizers 12 are shown in FIG. 15 through FIG. 17, respectively. The edge 12b of the upper polarizer 12 of FIG. 17 has varying roughness (Ra). The results are shown in FIG. 18.

Figure 18:
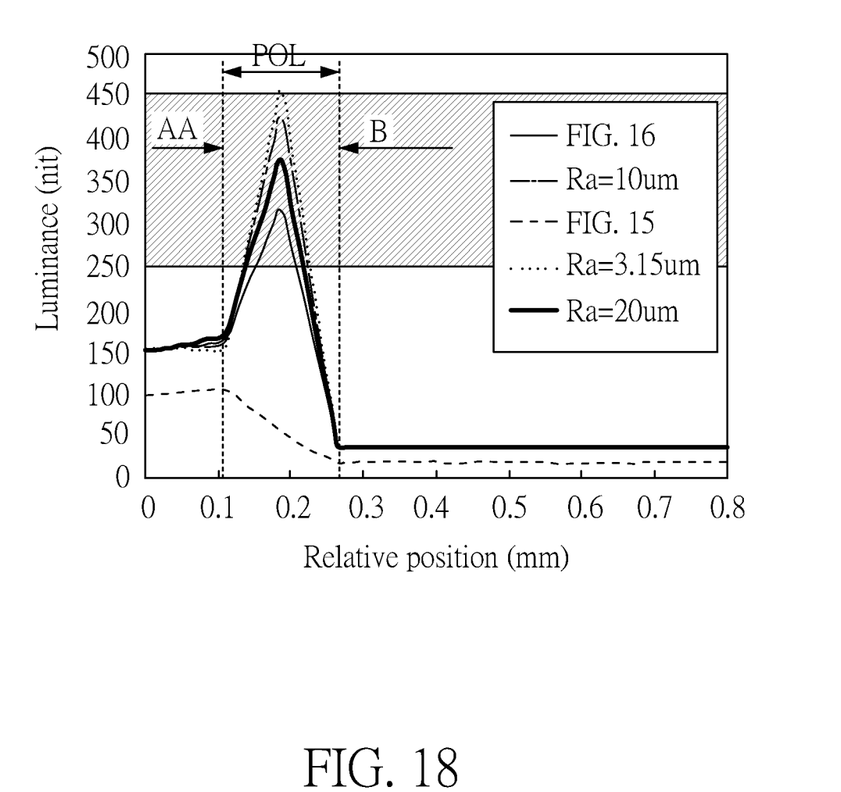
FIG. 18 is a measurement graph related to Test example of the present disclosure.

Therein, AA of FIG. 18 corresponds to the display region AA in each of FIG. 15 through FIG. 17. POL of FIG. 18 corresponds to the irregular edge region POL of the upper polarizer 12 in each of FIG. 15 through FIG. 17. B of FIG. 18 corresponds to the position of the frame 15 shown in FIG. 1. The shadowed region in FIG. 18 is the region of "border brightness". Herein, the so-called "border brightness" refers to the brightness measured at the peripheral region (non-displaying region) lit up by the light source (either from the ambience or from the internal backlight) when the display device is supplied with images (signals).

As shown in FIG. 18, when the upper polarizer 12 of FIG. 15 is used, the measured luminance is lower than the border brightness. Due to the lateral of the upper polarizer 12 with a flush design, the edge 12b of the upper polarizer 12 is highly visible. When the upper polarizer 12 of FIG. 16 is used, the measured luminance is closer to the border brightness. This is because the third film 125 is narrower, and external light is partially reflected, making the edge 12b of the upper polarizer 12 visually blurred. When the upper polarizer 12 of FIG. 17 is used, as the roughness at the edge 12b of the upper polarizer 12 increases, the measured luminance is compatible to the border brightness. This is because the non-flush design of the edge 12b of the upper polarizer 12 can well scatter light from the external light source, thereby visually blurring the edge 12b of the upper polarizer 12, and making the edge 12b of the upper polarizer 12 less visible to the user. This gives an illusion to the user that the panel's visible area is increased, thereby optimizing the visible range.

To sum up, the disclosed display device features for a polarizer having an edge of a non-flush design that scatters light, so as to visually blur the polarizer's edge, and make the polarizer's edge less visible, thereby optimizing the visible range.

In the present disclosure, the display device made according to any of the foregoing embodiment may be used in combination with a touch panel, so as to form a touch display device. Also, the display device or the touch display device made according to any of the foregoing embodiment of the present disclosure is applicable to any electronic device that needs a display screen as known in the art, such as a monitor, a mobile phone, a laptop computer, a camera, a still camera, a music players, a mobile navigator, a TV set and any electronic device that displays images.

Although the present disclosure has been explained in relation to its embodiment, it is to be understood that many other possible modifications and variations can be made without departing from the spirit and scope of the disclosure as hereinafter claimed.

What is claimed is:
1. A display device, comprising:
a substrate;
a display medium layer, disposed on the substrate; and
a polarizer, disposed on the display medium layer, wherein the polarizer at least comprises a first film, a second film, and a third film that are sequentially laminated, the first film connects to the second film, the second film connects to the third film, the first film has a first bottom surface, the first bottom surface has a first edge, the second film has a second bottom surface, the second bottom surface has a second edge adjacent to the first edge, the third film has a third bottom surface, and the third bottom surface has a third edge adjacent to the second edge,
wherein, in a first direction perpendicular to the first edge and a normal direction of the substrate, a first minimum distance exists between a projection of the first edge and a projection of the second edge on the substrate, a second minimum distance exists between the projection of the second edge and a projection of the third edge on the substrate, and the first minimum distance and the second minimum distance are different,
wherein the first film has a first lateral wall, a first angle is included between the first lateral wall and the first bottom surface, the second film has a second lateral wall, a second angle is included between the second lateral wall and the second bottom surface, and the first angle is different from the second angle.
2. The display device of claim 1, wherein in the first direction, a width of the first film is greater than a width of the second film, and the width of the second film is greater a width of the third film.
3. The display device of claim 1, wherein in the normal direction view of the substrate, the second edge of the second film is exposed by the third film and the first edge of the first film is exposed by the second film.

4. The display device of claim 1, wherein in the first direction, a width the second film is less than a width the third film and a width the first film.

5. The display device of claim 1, wherein a projection of the second film on the substrate is located within a projection of the first film on the substrate, and the projection of the second film on the substrate is located within a projection of the third film on the substrate.

6. The display device of claim 1, further comprising a frame surrounding the substrate, wherein a horizontal distance between the second edge and the frame is greater than a horizontal distance between the third edge and the frame.

7. The display device of claim 6, further comprising a colloid disposed between the frame and the polarizer, wherein a part of the colloid is disposed between the first film and the third film.

8. The display device of claim 1, wherein the substrate is a flexible substrate.

9. The display device of claim 1, further comprising a support portion, wherein the substrate is disposed on the support portion, and an area the substrate is greater than an area the support portion.

10. The display device of claim 1, wherein at least two of the first film, the second film, and the third film are made of different materials.

11. The display device of claim 1, wherein the display medium layer is an organic layer.

12. The display device of claim 1, further comprising:
an counter substrate, disposed between the polarizer and the display medium layer.

13. The display device of claim 12, wherein the display medium layer comprises liquid crystal, organic light emitting diodes or micro light emitting diodes layer.

14. A display device, comprising:
a substrate;
a display medium layer, disposed on the substrate; and
a polarizer, disposed on the display medium layer, wherein the polarizer at least comprises a first film, a second film, and a third film that are sequentially laminated, the first film connects to the second film, the second film connects to the third film, the polarizer has a top surface and a bottom surface, the bottom surface is a surface of the polarizer facing the display medium layer, and the top surface is opposite to the bottom surface;
wherein, in a cross-section view of the substrate, a fourth edge of the top surface of the polarizer and a fifth edge of the bottom surface of the polarizer form an imaginary line, a first bottom surface of the first film has a first edge, a second bottom surface of the second film has a second edge, a third bottom surface of the third film has a third edge, a third edge is adjacent to the second edge, a third minimum distance is a distance between the second edge and the imaginary line, a fourth minimum distance is a distance between the third edge and the imaginary line, and the third minimum distance is different from the fourth minimum distance,
wherein the first film has a first lateral wall, a first angle is included between the first lateral wall and the first bottom surface, the second film has a second lateral wall, a second angle is included between the second lateral wall and the second bottom surface, and the first angle is different from the second angle.

15. The display device of claim 14, wherein in the normal direction view of the substrate, the second edge of the second film is exposed by the third film, and the first edge of the first film is exposed by the second film.

16. The display device of claim 14, wherein a width the second film is less than a width of the third film and a width the first film.

17. The display device of claim 14, wherein a projection of the second edge on the substrate is located between a projection of the first edge and a projection of the third edge on the substrate.

18. The display device of claim 14, further comprising a colloid, wherein at least a part of the colloid is disposed between the first film and the third film.

19. The display device of claim 14, wherein the third minimum distance is greater than or equal to 0.001 mm and less than or equal to 0.1 mm.

* * * * *